United States Patent
Sugimoto et al.

(10) Patent No.: US 7,490,192 B2
(45) Date of Patent: Feb. 10, 2009

(54) METHOD AND APPARATUS FOR SETTING INPUT TERMINALS FOR RECEIVING CONTROL INFORMATION IN A SEMICONDUCTOR MEMORY DEVICE

(75) Inventors: Satoru Sugimoto, Kasugai (JP); Kenta Kato, Seto (JP)

(73) Assignee: Spansion LLC, Sunnyvale, CA (US)

( * ) Notice: Subject to any disclaimer, the term of this patent is extended or adjusted under 35 U.S.C. 154(b) by 536 days.

(21) Appl. No.: 11/192,562

(22) Filed: Jul. 29, 2005

(65) Prior Publication Data
US 2006/0023508 A1 Feb. 2, 2006

Related U.S. Application Data

(63) Continuation of application No. PCT/JP2004/010844, filed on Jul. 29, 2004.

(51) Int. Cl.
G06F 13/00 (2006.01)
(52) U.S. Cl. .................... 711/103; 711/154
(58) Field of Classification Search ............ None
See application file for complete search history.

(56) References Cited

U.S. PATENT DOCUMENTS 6,518,823 B1 * 2/2003 Kawai .................. 327/525

FOREIGN PATENT DOCUMENTS

| JP | 06-203584 | 7/1994 |
|---|---|---|
| JP | 10-106275 | 4/1998 |
| WO | WO 01/75892 A2 | 10/2001 |

* cited by examiner

*Primary Examiner*—Reginald G Bragdon
*Assistant Examiner*—Shawn X Gu
(74) *Attorney, Agent, or Firm*—Ingrassia Fisher & Lorenz, P.C.

(57) ABSTRACT

In inputting control information for setting access conditions in a system having a common data bus (3), when a predetermined bit string making up an access condition setting command is inputted to predetermined terminals which are not data input/output terminals (S3), the predetermined terminals are set as control information input terminals (S5) and inputted control information is temporarily maintained in a non-volatile memory device (S13). When inputting of control information is completed (S15), the control information that has been temporarily maintained is stored in a non-volatile memory region all at once (S17). During an access condition setting operation, the data input/output terminals are released (S7) and the data bus (3) is made available to other banks or devices (2) so that data transfer efficiency of the system can be improved.

22 Claims, 10 Drawing Sheets

(A) SETTING TO CHANGE WORD LINE SELECTION FROM CYCLE TO CYCLE (B) SETTING TO CHANGE BANK SELECTION FROM CYCLE TO CYCLE

FIG. 7

| AD(22:0) | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| WPI(A) | 0 | 0 | 20 | 19 | 18 | 17 | 16 | 15 | 14 | 13 | 12 | 11 | 10 | 9 | 8 | 7 | 6 | 5 | 4 | 3 | 2 | 1 | 0 |
| WPI(B) | 0 | 1 | 41 | 40 | 39 | 38 | 37 | 36 | 35 | 34 | 33 | 32 | 31 | 30 | 29 | 28 | 27 | 26 | 25 | 24 | 23 | 22 | 21 |
| WPI(C) | 1 | 0 | 62 | 61 | 60 | 59 | 58 | 57 | 56 | 55 | 54 | 53 | 52 | 51 | 50 | 49 | 48 | 47 | 46 | 45 | 44 | 43 | 42 |
| WPI(D) | 1 | 1 | 83 | 82 | 81 | 80 | 79 | 78 | 77 | 76 | 75 | 74 | 73 | 72 | 71 | 70 | 69 | 68 | 67 | 66 | 65 | 64 | 63 |

METHOD AND APPARATUS FOR SETTING INPUT TERMINALS FOR RECEIVING CONTROL INFORMATION IN A SEMICONDUCTOR MEMORY DEVICE

CROSS-REFERENCES TO RELATED APPLICATIONS

This is a continuation of International Application No. PCT/JP2004/010844, filed Jul. 29, 2004 which was not published in English under PCT Article 21(2).

TECHNICAL FIELD OF THE INVENTION

The present invention relates to setting of control information in a non-volatile memory device.

BACKGROUND OF THE INVENTION

Background Art

For an electrically rewritable non-volatile memory device such as an EEPROM or a flash memory, there are cases in which conditions for access to memory cells are set for each sector or each sector group with each sector or sector group composed of a predetermined number of memory cells. A protect function to control a state of write/erase prohibition or permission is a typical object of such setting. Access conditions are set individually for each sector or sector group. To set access conditions for sectors or sector groups, control information specifying an access condition is written for each of the sectors or sector groups in order.

There are two types of non-volatile memory devices. One type of non-volatile memory device requires more time for a write operation than for a read operation due to a physical phenomenon involved in the write operations. The other type of non-volatile memory device requires virtually the same amount of time for a write operation as for a read operation. The former type includes EEPROMs (Electrically Erasable Programmable Read Only Memories) and OUMs (Ovonic Unified Memories), and PFRAMs (Polymer Ferroelectric RAMs). The latter type includes MRAMs and FRAMs.

Figure 10:
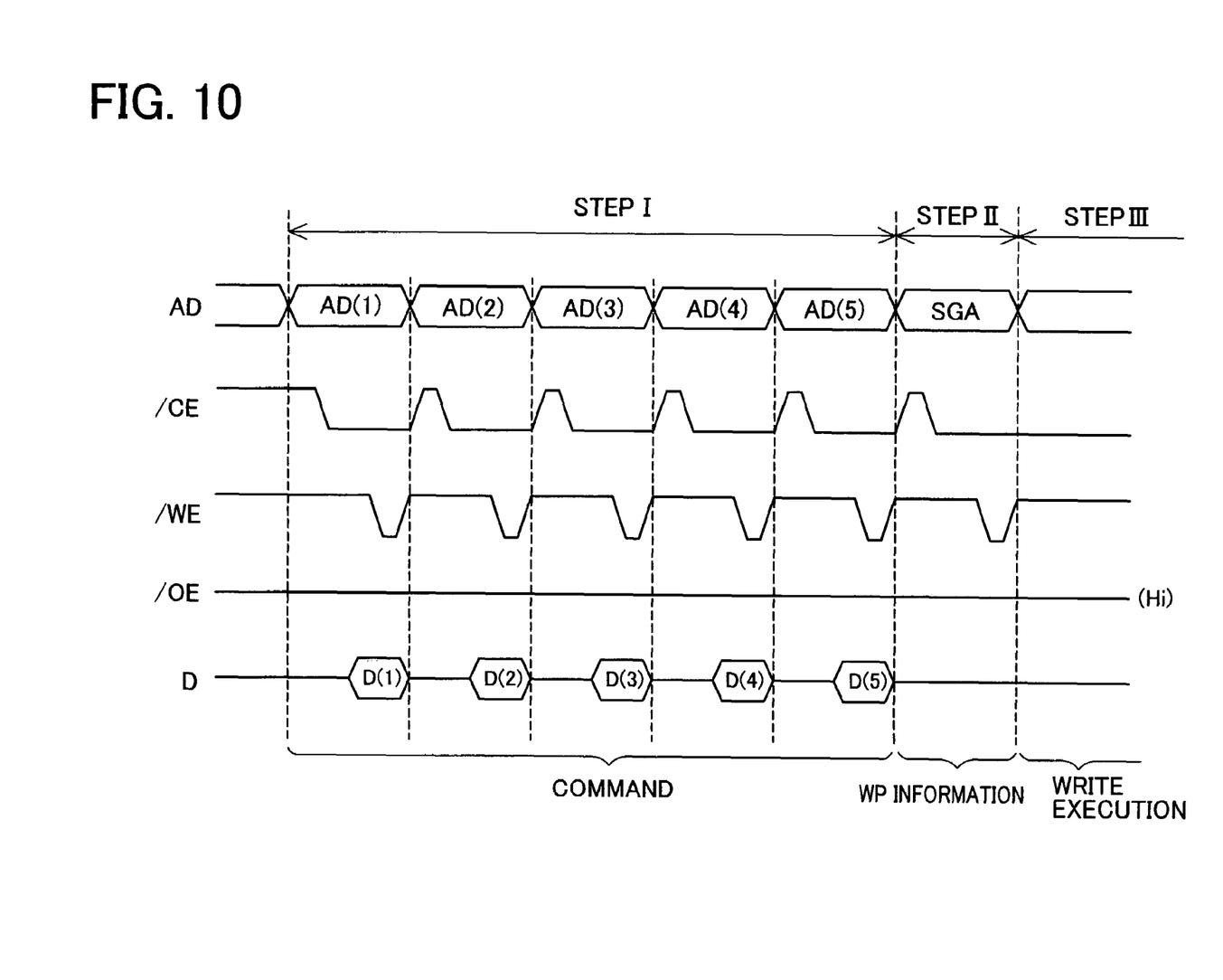
FIG. 10 shows a waveform of information setting operation according to the background art.

FIG. 10 shows an operation waveform of a control information writing sequence in a non-volatile memory device in which a write cycle is longer than a read cycle. In step I, there are five command cycles. In each of the command cycles, a write command, which is a data bit signal composed of a predetermined combination of data bits making up a predetermined code, is inputted to both address terminals and data input/output terminals. Executing a control information writing sequence changes access condition settings so that erroneously activating the control information writing sequence is not preferable. Using a data bit signal composed of a predetermined data bit combination unused in the ordinary operation sequence as a predetermined code prevents the control information writing sequence from being erroneously activated. Step II is composed of a write protect (WP) information cycle in which an SGA which represents a bit is being inputted at plural address terminals. Namely, each SGA bit represents protect information for one sector or sector group. Step III includes a write execution cycle. In the write execution cycle, protected information is rewritten to a non-volatile memory cell taking a long period of time as compared with a read cycle. To rewrite plural access conditions, steps I through III are repeated as many times as the number of access conditions to be rewritten. Compared with a read cycle whose length is on the order of several tens of nanoseconds, a write cycle ranges from several microseconds to several milliseconds.

The semiconductor memory device disclosed in Japanese Kokai Publication No. H10-106275 ("Patent Document 1") requires a virtually equal address access time for a read cycle and for a write cycle. In the semiconductor memory device of FIG. 10, when making write prohibition/permission settings for individual blocks, a write protect setting block is set, after seven read cycles (step I) are executed, by data inputted from data input/output terminals (I/O 0 to I/O 7) in the eighth cycle (step II), the eighth cycle being a write cycle. In the write cycle, write protect information written in non-volatile elements is rewritten. The eight bits of data inputted from the data input/output terminals (I/O 0 to I/O 7) represent control information for the eight blocks, respectively.

Problems To Be Solved By The Invention

As the capacity of a memory device grows larger, however, so does the number of sectors or sector groups in a memory device increase. In a non-volatile memory device which is required to perform a control information writing sequence for each sector or sector group as described in the Background Art section above, a substantial amount of time may be required to set access conditions. Therefore, there is a possibility that, while, for example, steps I and II are repeatedly executed in writing control information, the data input/output terminals are occupied and, thus, not available for other operations.

Particularly, in a non-volatile memory device in which a write cycle is longer than a read cycle, writing control information for each sector or sector group will take a substantial amount of time. The time required for writing control information increases as the capacity of a targeted memory device becomes larger. Eventually, the data input/output terminals of such a memory device may be occupied for an extended period of time while control information writing is performed.

In addition, when inputting a command to activate a control information writing sequence, it is necessary to input a predetermined code composed of data inputted from address terminals and data input terminals. During the time a command is being inputted, therefore, the data input/output terminals are continuously occupied.

When the method disclosed in Patent Document 1 is applied to a non-volatile memory device in which a write cycle is longer than a read cycle, a write protect setting block corresponding to the bit positions for the data input/output terminals is set, after seven read cycles (step I) are executed, in the eighth cycle (step II). In the subsequent write cycles (step III), i.e., those following the eighth cycle, access conditions are written to non-volatile elements, taking a long time. In a case in which the method is applied to a non-volatile memory device in which a write cycle is longer than a read cycle, too, the data input/output terminals of the device are occupied during a control information writing sequence.

While the input/output terminals are occupied as described above in a non-volatile memory device having plural banks each of which can be accessed independently of others, a system controller cannot access banks other than the one for which the input/output terminals are being used or other system devices connected to the same data line as the non-volatile input memory device. When a non-volatile memory device has plural banks and/or when plural devices including the non-volatile memory device are connected to a common data line in a system, executing a sequence to write control information to a bank in the non-volatile memory device disables the system controller, preventing access to other banks in the non-volatile memory device and/or other devices in the system. Such a system, therefore, poses a problem that data transfer efficiency of the system cannot be improved.

SUMMARY OF THE INVENTION

Means For Solving The Problem

The present invention solves problems with the foregoing conventional technology and has an object to provide an information setting method for a non-volatile memory device, the non-volatile memory device, and a system incorporating them, making it possible, in the device and in the system, to input control information in accordance with a setting command in a small amount of time without occupying data input/output terminals.

The information setting method for a non-volatile memory device, according to the present invention is characterized by the step of, in having control information set from an external source, when a setting command is inputted to predetermined terminals other than data input/output terminals, the predetermined terminals are set as input terminals for receiving the control information.

The non-volatile memory device according to the present invention is characterized by comprising a command recognize section for recognizing the input of a setting command to predetermined terminals other than data input/output terminals and a control section for setting the predetermined terminals as input terminals for the control information in accordance with a recognition signal from the command recognize section.

In a system incorporating an information setting method for a non-volatile memory device in which control information is set from an external source, the non-volatile memory device or other devices being connected to a controller via one data line and, during the time the controller sets control information for one memory region of the non-volatile memory device via predetermined terminals other than the data input/output terminals, data is communicated between the controller and another memory region of the non-volatile memory device or another device via the data line.

Effect Of The Invention

Since a setting command and control information are inputted via predetermined terminals other than the data input/output terminals, the data input/output terminals can be released during the time a setting command and control information are being inputted.

While a setting command is being inputted and also while control information is being inputted after the setting command is recognized, the data input/output terminals can be released. Even during execution of a setting command targeting one of a plurality of predetermined memory regions (banks) with which the non-volatile memory device is provided and access to each of which can be controlled independently of others, other predetermined memory regions (banks) than the targeted one and other devices connected to the same data line as the non-volatile memory device can be accessed. Hence, data transfer efficiency of the system can be improved.

According to the present invention, an information setting method for a non-volatile memory device and a non-volatile memory device can be provided which make it possible, in a system incorporating a non-volatile memory device having plural predetermined memory regions access to each of which can be controlled independently of others and/or having other devices than the non-volatile memory device connected via a common data line, to input control information in accordance with a setting command in a small amount of time without occupying the data input/output terminals.

Also, since other predetermined terminals than the data input/output terminals are provided for use in setting control information for the non-volatile memory device during the time the controller sets control information in one memory region of the non-volatile memory device via the predetermined terminals other than the data input/output terminals, data communication is possible between the controller and another memory region of the non-volatile memory device or another device via the data line. Hence, data transfer efficiency of the system can be improved.

DESCRIPTION OF REFERENCE NUMERALS 1A, 1B Non-volatile memory device
2 Another device
3 Data bus
11 Command recognize section
13 Control section
15 Connecting section
17 Decoder
19 Selector
21 Temporarily-maintain sections
23 Store sections
25 End detection section
27 Write execute section
31 Data input/output section
33 Address input section
35 Memory core section
(ADD) Address terminals
(IO) Data input/output terminals
ADI1 First WP signal ADI2 Second WP signal
ADI3 Third WP signal

DETAILED DESCRIPTION OF THE INVENTION.

With reference to FIGS. 1 through 9, first and second embodiments of a non-volatile memory, an information setting method therefore, and a system incorporating them according to the present invention will be described in detail.

Figure 1:
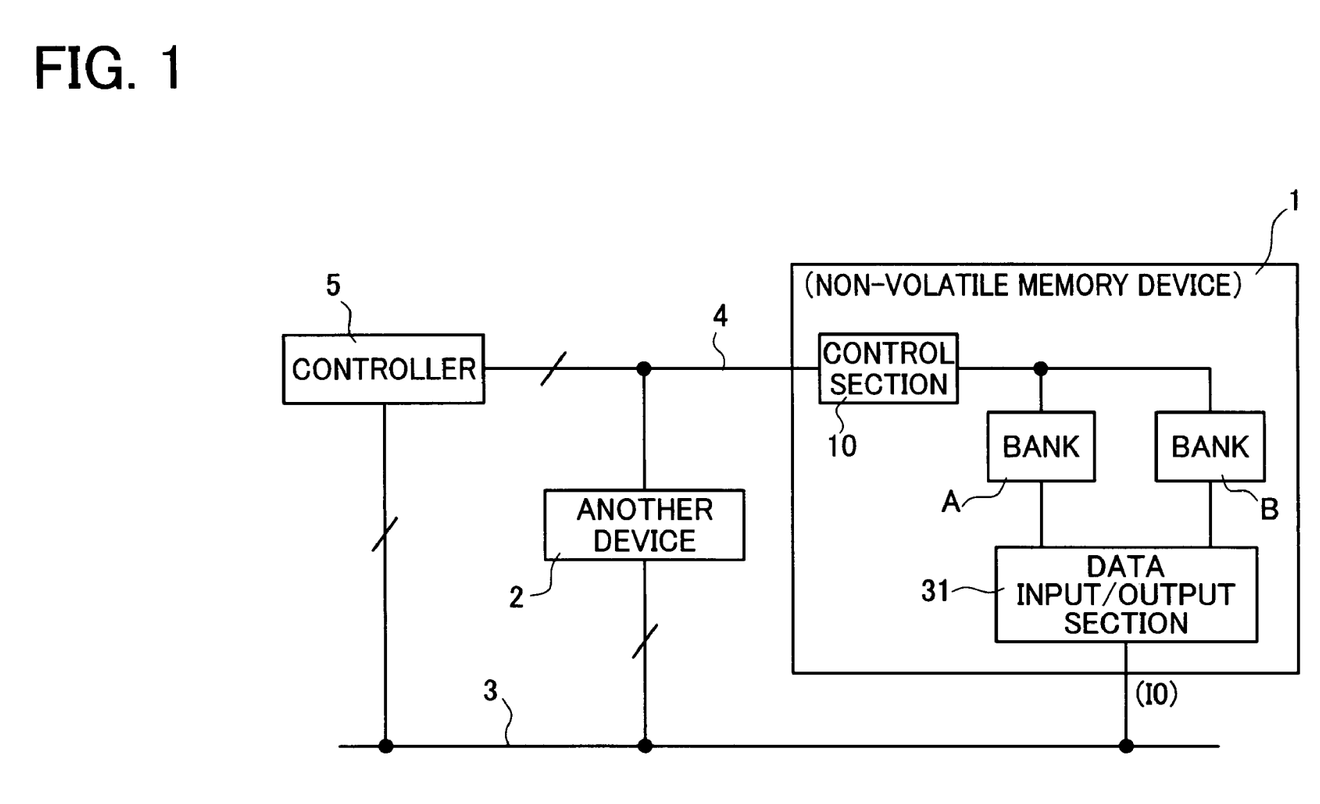
FIG. 1 shows a system including a non-volatile memory device according to the present invention.

Referring to FIG. 1, a system showing the principle of the present invention is shown. A controller 5 transmits a control information setting via a signal line 4, which is different from a data line 3, for electrically separating a non-volatile memory device 1 from the data line 3. During the time the above process is carried out, data communication is enabled between another device 2 and the controller 5. In a case in which the non-volatile memory device 1 has plural banks A and B, either one of the banks A and B may be separately electrically separated from the data line 3. The signal line 4 may be, for example, an address line.

Figure 2:
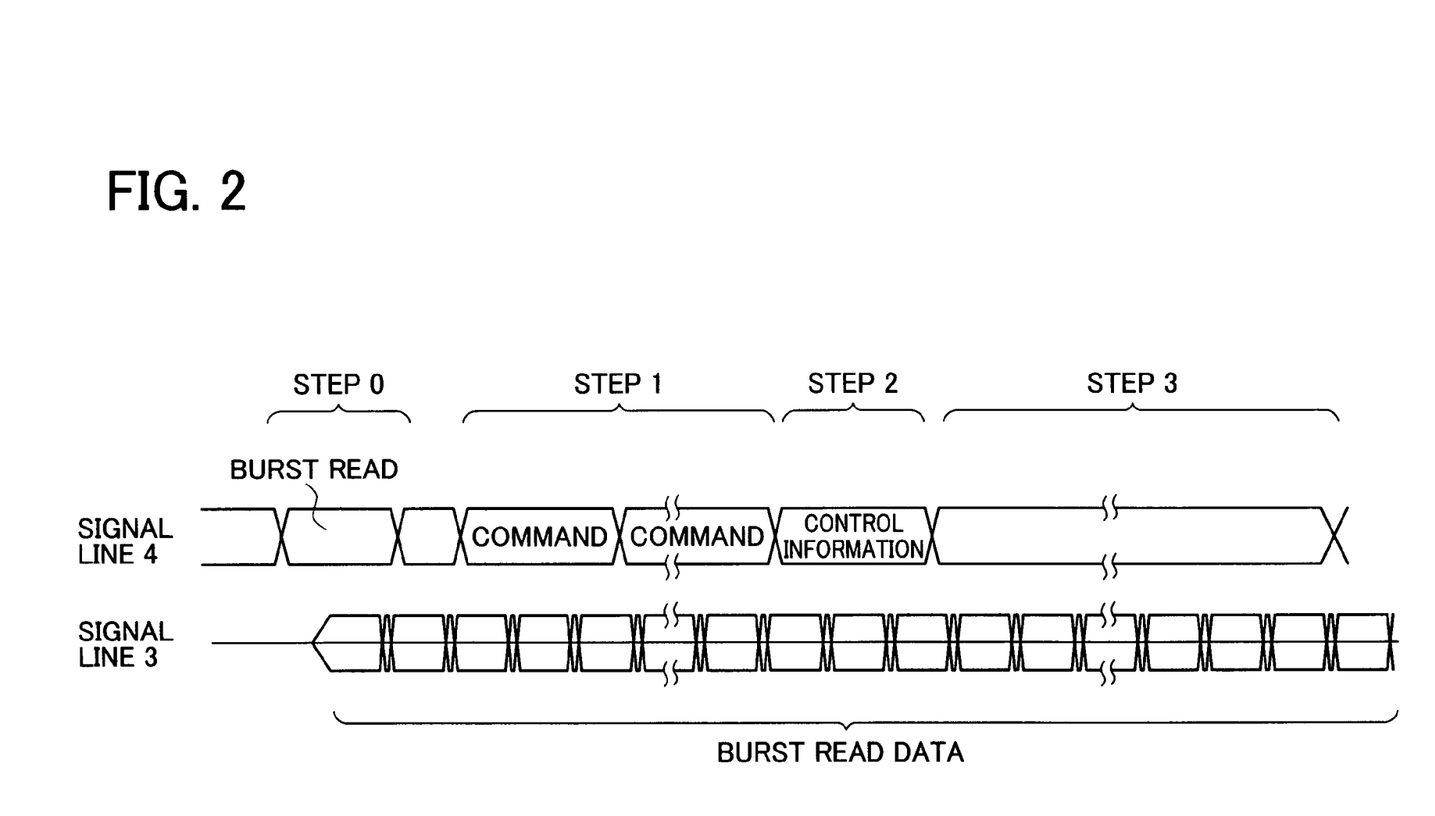
FIG. 2 is an operation waveform diagram of a system including a non-volatile memory device according to the present invention.

In the system, as the operation waveform of FIG. 2 shows, while the controller 5 is engaged in data communication with another device 2, in accordance with a read command, for example, the controller 5 can change control information settings in the non-volatile memory device 1. While, in a case in which the non-volatile memory device I is provided with the plural banks A and B, control information settings in a particular bank are changed while data communication can be made between the other bank not subjected to the control information setting and the controller 5.

Assume, for example, that, in step 0, a burst read command to make consecutive read accesses is issued to the bank B via the signal line 4. Also assume, for example, that, in step 1, a command to set control information is issued to the bank A via the signal line 4. Since the commands are transmitted via the signal line 4 different from the data line 3, the bank B can continue data communication with the controller 5 allowing data to be read successively from the bank B in the burst read operation even while the commands are issued via the signal line 4. In step 2, control information is issued to the bank A via the signal line 4. During this step, too, the bank B continues data communication with the controller 5 allowing data to be read successively from the bank B in the burst read operation. In step 3, the bank A performs a write operation based on the setting information. During this step, too, the bank B continues data communication with the controller 5 allowing data to be read successively from the bank B in the burst read operation.

The first and the second embodiments of the present invention will further be explained with reference to FIG. 3 and the subsequent figures. The explanation will be made based on example cases in which a condition for setting a write protect (hereinafter referred to as "WP") function for each of plural sectors or sector groups of an individual bank is used as an access condition and in which WP information for making a write prohibition/write permission setting for the bank is inputted as control information in accordance with a WP setting command.

Figure 3:
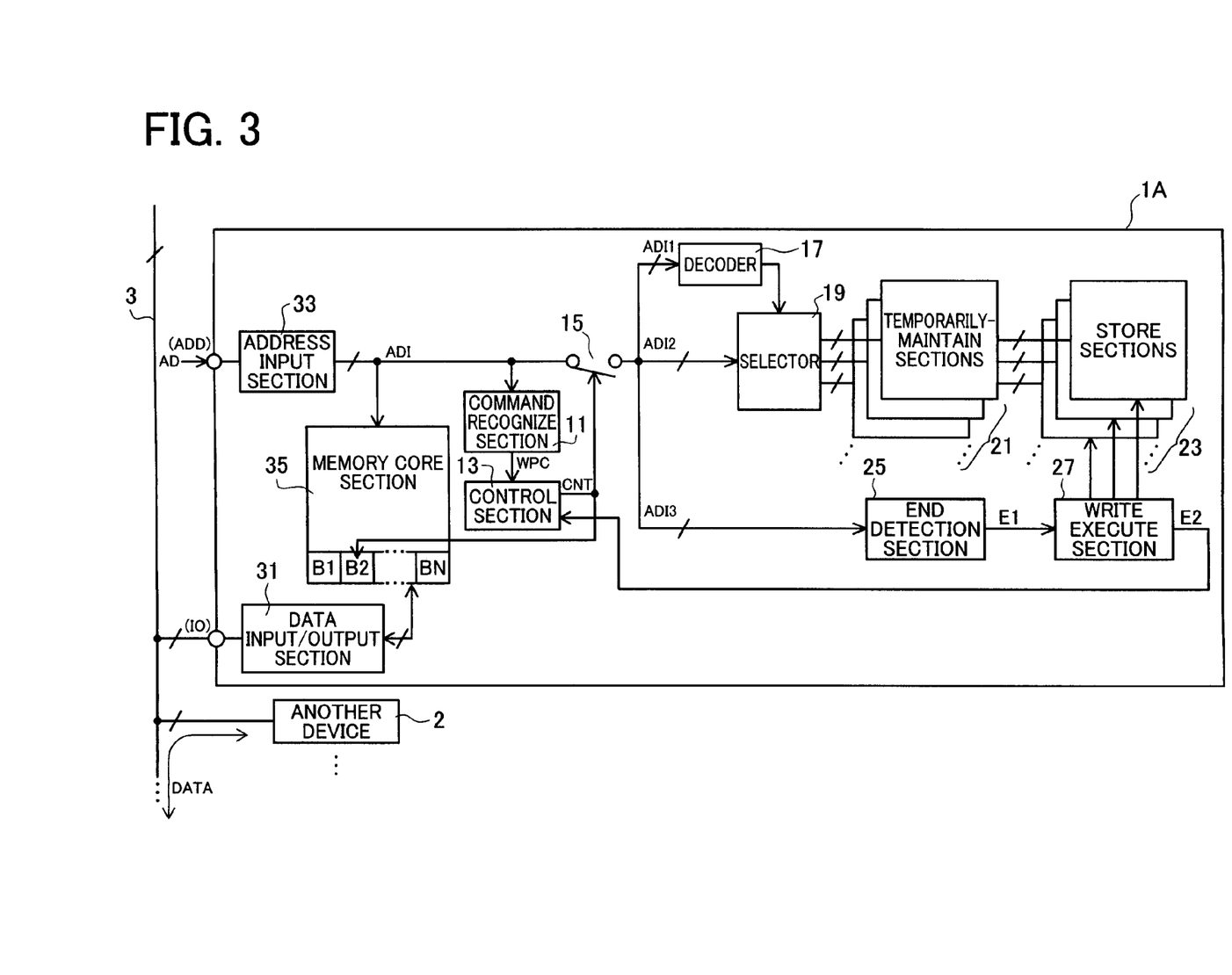
FIG. 3 is a circuit block diagram showing part of a system including a non-volatile memory device according to a first embodiment of the present invention.

In the system shown in FIG. 3, a non-volatile memory device 1A according to the first embodiment and another device 2 are connected via a common data bus 3. The data bus 3 is connected to data input/output terminals (IO) of the non-volatile memory device 1A.

The non-volatile memory device 1A provided with the data input/output terminals (IO) and address terminals (ADD) has a data input/output section 31 which receives data inputted or to be outputted via the data input/output terminals (IO) and an address input section 33 which receives address signals AD via the address terminals (ADD).

The address signals AD inputted to the address input section 33 are inputted as internal address signals ADI to a memory core section 35, a command recognize section 11, and a connecting section 15. In the memory core section 35, a plurality of memory cells of each bank are arranged.

The data input/output section 31 is connected to input/output sections B1 to BN of individual banks within the memory core section 35. In an ordinary data access operation, data is inputted or outputted to or from the input/output section of a bank selected according to the internal address signals ADI inputted to the memory core section 35.

The internal address signals ADI are also inputted to the command recognize section 11 where it is determined whether or not the inputted internal address signals ADI represent a command for setting WP conditions. When the inputted internal address signals ADI are recognized as representing a setting command directing rewriting of WP conditions, a command recognition signal WPC is outputted to a control section 13.

When the command recognition signal WPC is received, the control section 13 outputs a control signal CNT. The control signal CNT is inputted to the connecting section 15 and the memory core section 35. As a result of the control signal CNT, the connecting section 15 enters a conducting state thereby establishing signal paths for inputting the internal address signals ADI to a decoder 17, a selector 19, and an end detection section 25. In the memory core section 35, the control signal CNT is inputted to an inhibit terminal (INH) (not shown) of the input/output section of the bank targeted for rewriting WP conditions. As a result, the targeted bank is disconnected from the data input/output section 31.

For the purposes of this explanation, it is assumed that the command recognition signal WPC, while being a signal to inform that a setting command directing rewriting of WP conditions has been recognized, also includes information specifying a bank targeted for rewriting WP conditions. With the information provided, it is possible, to control the input/output section of the targeted bank so as to disconnect the targeted bank from the data input/output section 31 in addition to placing the connecting section 15 in a conducting state, In a case in which information on the targeted bank is inputted together with WP information after a relevant setting command is inputted, the input/output section of the targeted bank may be controlled using a signal different than the control signal CNT.

After the connecting section 15 enters a conducting state, the WP information provided by the internal address signals ADI is divided according to predetermined bit positions and the divided signals are inputted to the corresponding destinations among the decoder 17, the selector 19, and the end detection section 25. A first WP signal ADI1 is inputted as a recognition signal to the decoder 17. A second WP signal ADI2 is inputted to the selector 19. A third WP signal ADI3 is inputted to the end detection section 25. The second WP signal ADI2 is a WP signal to provide WP conditions which determine whether individual sectors or sector groups are write prohibited or write permitted. Each bit of the second WP signal ADI2 sets a write prohibition/write permission for a sector or a sector group.

When the number of sectors or sector groups targeted for setting a write prohibition/write permission is larger than the width in bits of the second WP signal ADI2, the identified sectors or sector groups are grouped into one group every time a number of sectors or sector groups are identified based on the width in bits of the second WP signal ADI2.

The first WP signal ADI1 is a signal to identify the groups generated by such a process. The first WP signal ADI1 is decoded by the decoder 17 and then inputted to the selector 19. At the selector 19, the second WP signal ADI2 is inputted to one of temporarily-maintain sections 21 identified according to the first WP signal ADI1. The temporarily-maintain sections 21 correspond on a one-to-one basis to the groups of sectors or the groups of sector groups identified based on the width in bits of the second WP signal ADI2. For each of the groups of sectors or the groups of sector groups identified by the first WP signal ADI1, a temporarily-maintain section 21 is selected and the second WP signal ADI2 inputted together with the first WP signal ADI1 is temporarily maintained in the selected temporarily-maintain section 21. The temporarily-maintain sections 21 are of a volatile nature.

The third WP signal ADI3 is a status signal to indicate WP information input status. An input of WP information is determined to have ended when the third WP signal ADI3 is detected in the end detection section 25. When the third WP signal ADI3 is a signal to indicate that WP information is being inputted or that inputting of WP information has ended, then the end detection section 25 can output a WP information input end signal E1 by detecting an end or start of detection of the third WP signal ADI3. Or, when the third WP signal ADI3 is a signal to indicate a start of WP information input operation, providing the end detection section 25 with a timer function makes it possible to start timing when the third WP signal ADI3 is inputted and to output an input end signal E1 after a predetermined amount of time elapses.

When an input end signal E1 is received, a write execute section 27 starts a write operation. During the write operation, the WP signals that have been temporarily maintained in the temporarily-maintain sections 21 are written to store sections 23 corresponding to the temporarily-maintain sections 21 on a one-to-one basis. The store sections 23 are of a non-volatile nature. Writing to the store sections 23 is controlled in the same manner as for writing to ordinary non-volatile memory cells. Due to a physical phenomenon involved in a write operation, writing to non-volatile memory cells takes a longer time than reading. For example, in a write operation, a write cycle and a verify cycle are repeated to carry on writing while verifying the status of writing. A write operation includes programming to or erasing from non-volatile memory cells. When it is determined based on a verify cycle that writing has ended, a write end signal E2 is outputted. The write end signal E2 is inputted to the control section 13 and cancels the control signal CNT. With the cancellation of the control signal CNT, setting of access conditions in the non-volatile memory device 1A ends and the non-volatile memory device IA returns to an ordinary state in which access to the memory core section 35 is allowed. That is, the connecting section 15 enters a non-conducting state and the signal path used to temporarily maintain the internal address signals ADI is broken. At the same time, the access-inhibited state of the input/output section of the bank that has been subjected to rewriting of WP conditions is canceled. When an access command is received, data can be inputted or outputted between the bank and the data input/output section 31.

Figure 4:
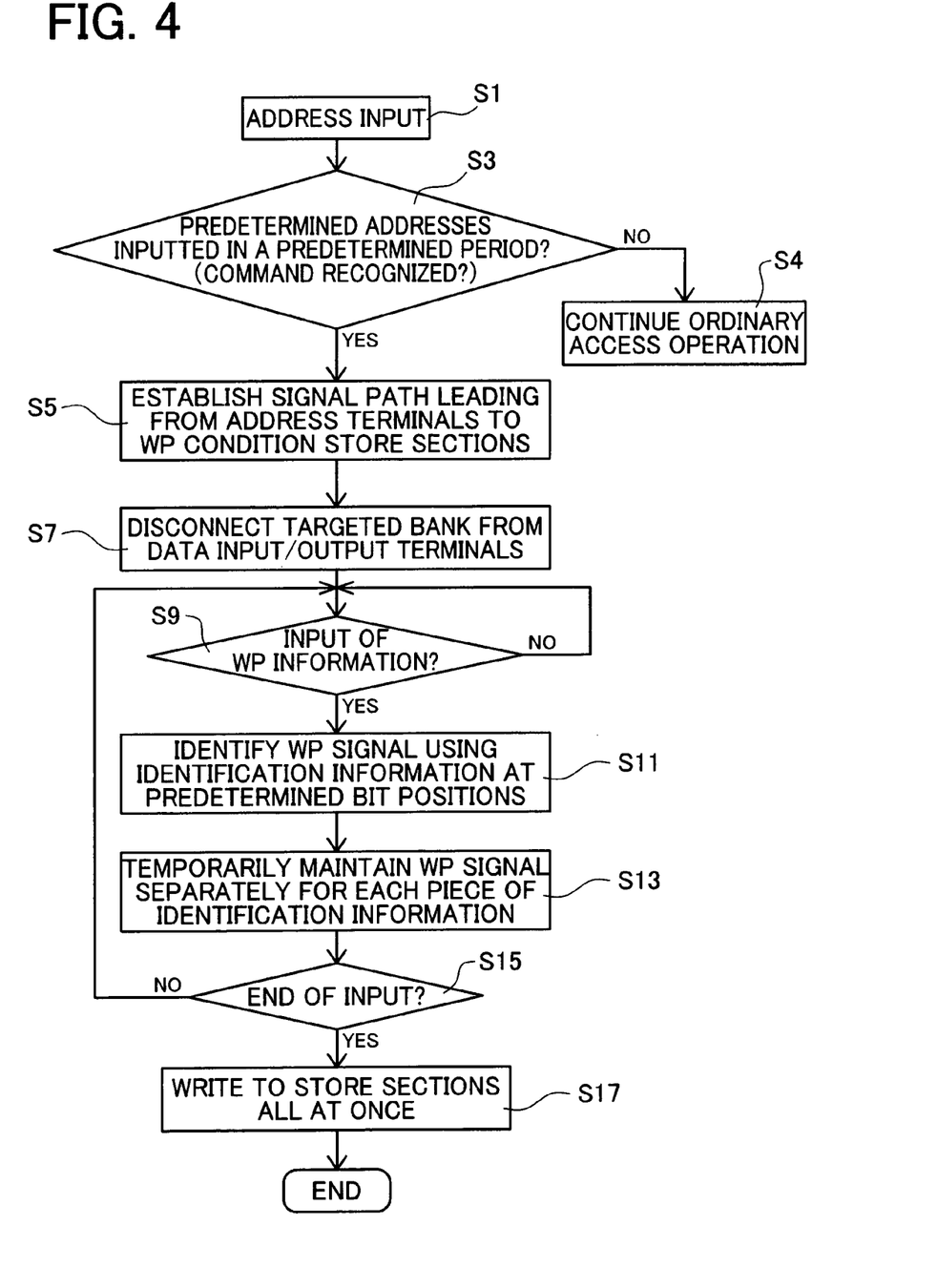
FIG. 4 is a flow diagram showing an information setting method for the non-volatile memory device according to the first embodiment of the present invention.

FIG. 4 is a flow diagram showing an operation flow for setting WP conditions in the non-volatile memory device 1A according to the first embodiment of the present invention. When addresses are inputted to the address input section 33 (S1), a process to recognize a command is performed in the command recognize section 11. During the process, it is checked whether the inputted addresses are a predetermined number of predetermined addresses inputted in a predetermined period (S3). A WP condition setting command is a predetermined bit string composed of predetermined addresses inputted over a predetermined number of cycles in a predetermined input period.

For example, as described later, when addresses specifying a different word line and/or a different bank in each input cycle are allocated, the possibility of coincidence occurring between such allocated addresses and addresses for an ordinary address access operation can be minimized. Furthermore, it is desirable to set the cycle time of a setting command to be shorter than a cycle time for an ordinary address access operation. By doing so, an ordinary access operation can be prevented from being erroneously recognized as a setting command.

When the inputted addresses are not recognized as a setting command (S3: NO), the inputted addresses are for an ordinary access operation so that an ordinary access operation is continued (S4). When the inputted addresses are recognized as a setting command (S3: YES), a WP condition writing sequence follows.

First, a signal path leading from the address terminals (ADD) to the WP condition store sections 23 is established (S5) wherein the connecting section 15 enters a conducting state thereby establishing the signal path. Then, the targeted bank is disconnected from the data input/output terminals (IO) (S7) by inhibiting access to the input/output section of the targeted bank and breaking the data input/output path between the targeted bank and the data input/output section 31. In the WP condition writing sequence, therefore, ordinary access to the targeted bank is not made so that the data input/output path leading to the targeted bank is broken. Since the data bus 3 is made available to another bank and/or another device 2, data can be inputted to and outputted from another bank and/or another device 2 even while the WP condition writing sequence is executed for the targeted bank. As a result, data transfer efficiency in the system can be improved.

Next, an input of WP information is awaited (S9: NO). When WP information is inputted as an internal address signals ADI (S9: YES) of the WP information composed of a predetermined number of bits, the first WP signal ADI1 stored at predetermined bit positions is used as identification information to identify a WP signal inputted as the second WP signal ADI2 (S11). The WP signal thus identified is temporarily maintained, being separated for each piece of identification information (S13), that is the identification information is decoded at the decoder 17 and controls the selector 19 to cause the WP signal to be maintained in the corresponding one of the temporarily-maintain sections 21.

The status of WP information input is monitored (S15) and, when it is determined that the input of WP information has not been completed (S15: NO), processing returns to an earlier step (S9) so as to wait for the subsequent WP information to be inputted and the WP signal is temporarily maintained in a region corresponding to the identification information. When it is determined that the input of WP information has been completed (S15: YES), the WP signals that have been inputted and temporarily maintained are stored in the corresponding store sections 23 all at once. At this time, the WP signals corresponding to plural WP conditions for as many sectors or sector groups are written to the corresponding store sections 23 all at once (S17) even though, in non-volatile memory cells, writing takes a longer time than a read cycle due to a physical phenomenon involved in a write operation to the store sections 23. In this way, the time required for writing can be greatly reduced compared with when executing a write operation for a sector or a sector group at a time.

Figure 5:
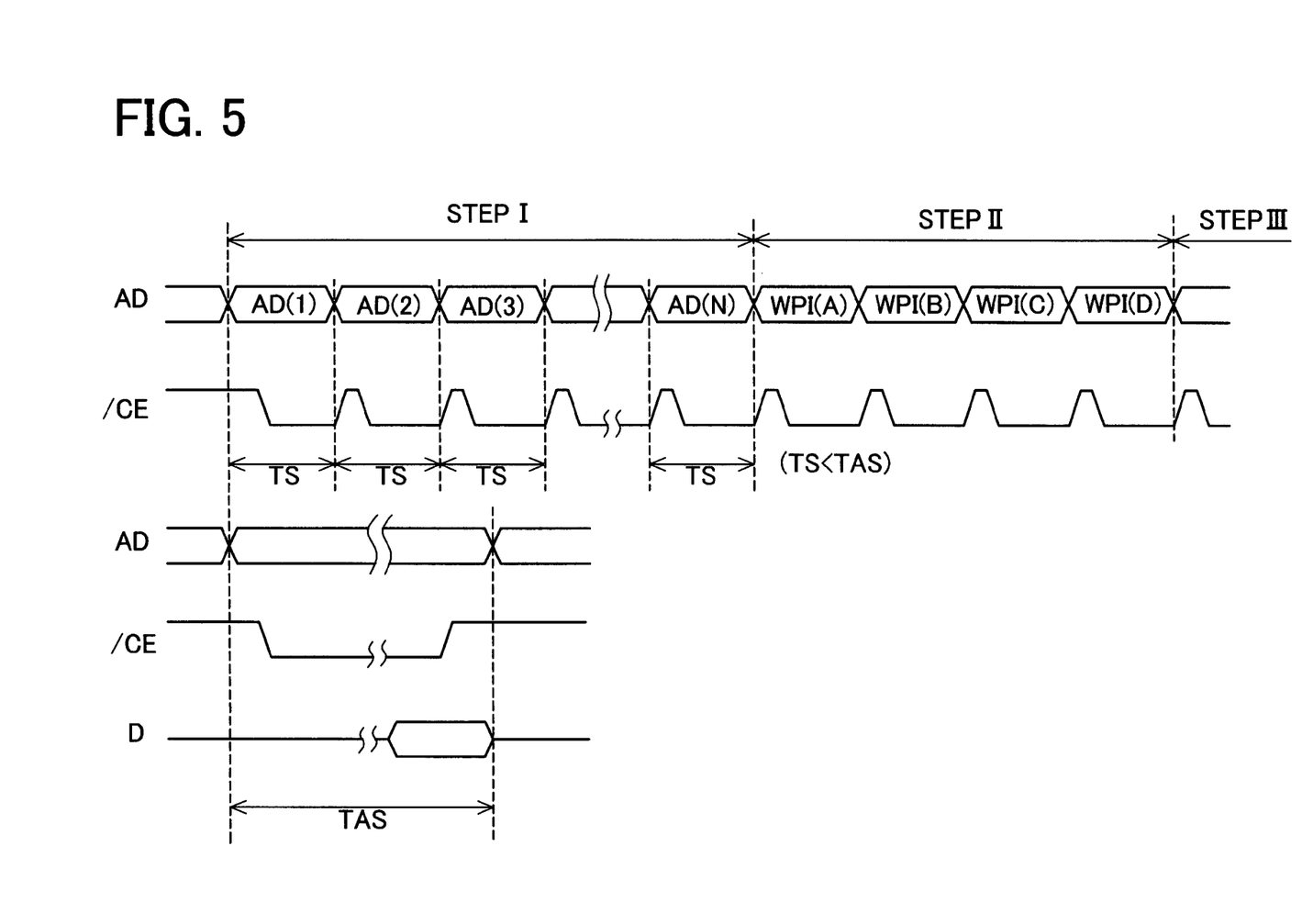
FIG. 5 shows an information setting operation waveform.
Figure 6:
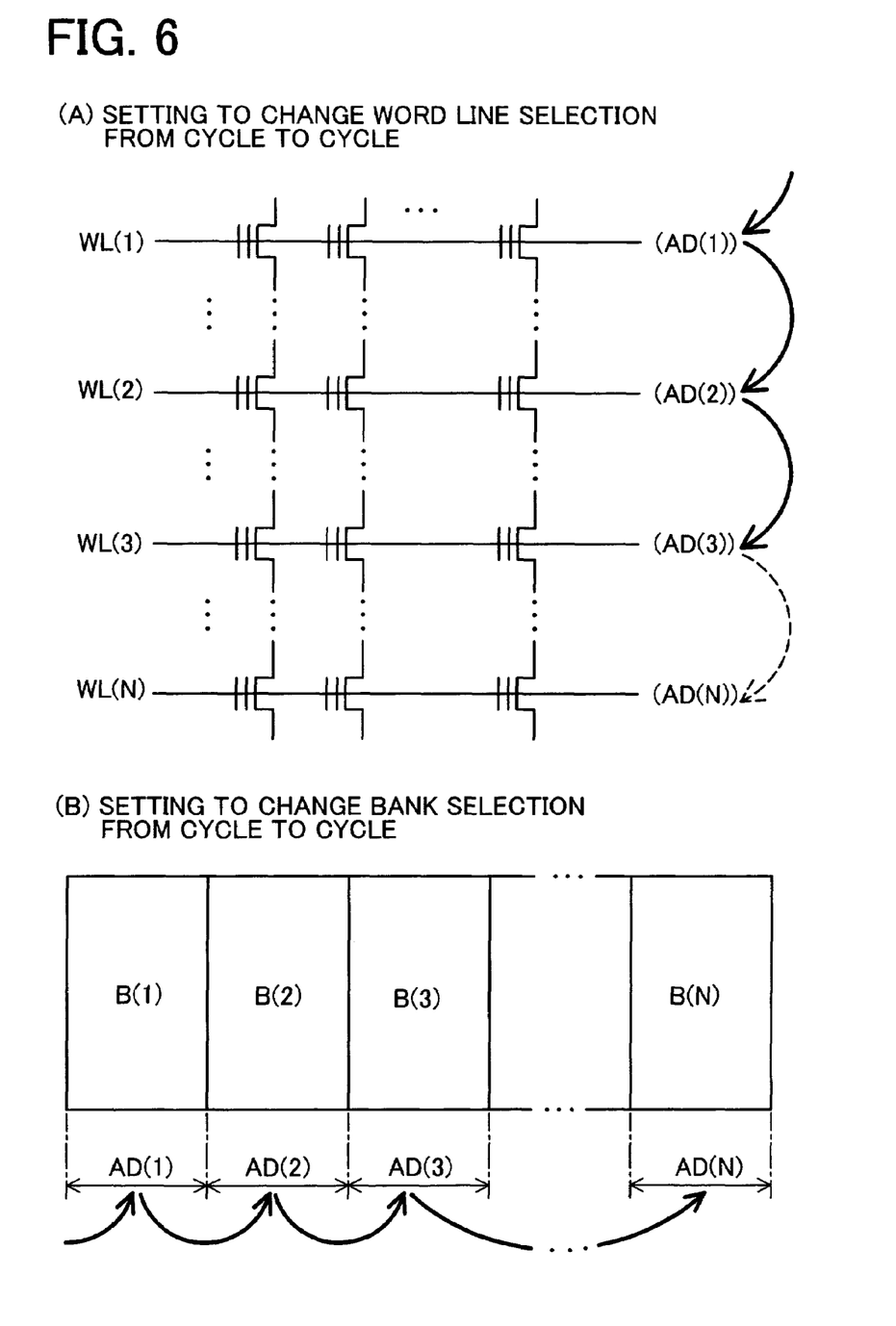
FIG. 6 is a diagram showing an example of setting command allocation in step I of FIG. 5.

FIG. 5 shows an operation waveform of the WP condition writing sequence. The writing sequence is composed of three steps, i.e. step I to step III. A chip enable terminal /CE is set at a low level and the non-volatile memory device 1A is activated. At the same time, address signals are inputted from the address terminals (ADD). In step I, a setting command is inputted. Address signals AD (1) to AD (N) are inputted from the address terminals (ADD) in N cycles with the cycle time being TS. In the command recognize section 11, the bit string formed by combining N sets of inputted address signals is examined to determine if it coincides with a predetermined bit string. It coincides when the address signals AD (1) to AD (N) are arranged, as shown in FIG. 6, to select word lines WL (1) to WL (N) and/or banks B (1) to B (N). When such an arrangement is made, at least either a different word line or a different bank can be selected in order in each cycle of step I.

In an ordinary access operation, word line selection or bank selection does not change from cycle to cycle. Thus, when only bit line selections are changed while word line section or bank selection is not, a burst operation to successively access data already read out to bit lines can advantageously be performed at high speed by controlling column selection only. When word line selection or bank selection is changed, it becomes necessary to additionally perform row control including memory cell selection so that a substantial amount of access time is required. An access operation in which word line selection or bank selection is effected by changing addresses is referred to as an address access operation. An access time in an address access operation is defined as an access time TAS inclusive of time needed for row-related operation. The controller to access the non-volatile memory device does not adopt such a method in which the access time TAS is successively used to access the non-volatile memory device and which reduces access efficiency or the efficiency of data transfer over system buses.

The cycle time TS is considered shorter than the cycle time TAS for an ordinary access operation (TS<TAS). Addresses are changed in a period shorter than the cycle time TAS allowed for an address access operation and, therefore, when a setting command is inputted from the address terminals (ADD), the setting command is not mistaken as being associated with an ordinary address access operation.

In step II, WP information is inputted. WP information WPI (A) to WPI (D) are inputted via the address terminals (ADD) in four cycles. In the present example, there are more targeted sectors or sector groups than the number of bits of the second WP signal ADI2 defining the number of WP conditions that can be set. Allocating two bits as the first WP signal ADI1 included in WP information makes it possible to identify four kinds of WP information WPI (A) to WPI (D). It is then possible to set WP conditions for four times as many sectors or sector groups as the number of sectors or sector groups for which WP conditions can be set by the second WP signal ADI2. This method is superior, in terms of processing speed and the number of elements required, to a method in which WP information is transmitted after being decoded by a memory controller and is subsequently encoded in the non-volatile memory device.

Figure 7:
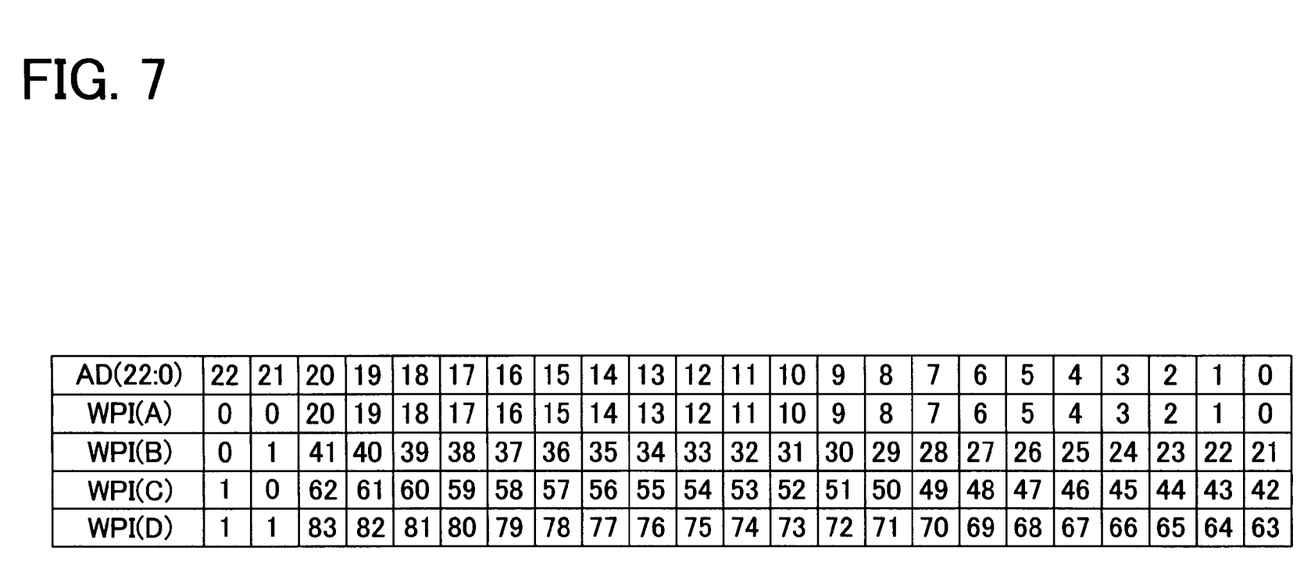
FIG. 7 is a diagram showing an example of allocation of identification information and WP information in step II of FIG. 5.

An example of WP information inputted in step II is shown in FIG. 7. FIG. 7 depicts an example in which the address signals AD are 23 bits wide. The two high-order bits of the address signal, AD (22) and AD (21), are allocated as the first WP signal, making it possible to identify four kinds of WP information WPI (A) to WPI (D). A sector or a sector group can be allocated to each of the 21 low-order bits of the address signals, AD (20) to AD (0). Next, a write prohibited or write permitted state is set for each of the sectors or sector groups allocated to the 21 bits. The setting can be made, for example, by using a high-level signal to represent a write prohibited state and a low-level signal to represent a write permitted state.

Since the WP information WPI (A) to WPI (D) can be identified based on the address signals AD (22) and AD (21), it is possible to set WP conditions for a maximum of 84 sectors or sector groups individually. More particularly, with the WP information WPI (A), WP conditions for sectors or sector groups 0 to 20 can be set; with the WP information WPI (B), WP conditions for sectors or sector groups 21 to 41 can be set; with the WP information WPI (C), WP conditions for sectors or sector groups 42 to 62 can be set; and with the WP information WPI (D), WP conditions for sectors or sector groups 63 to 83 can be set.

Figure 8:
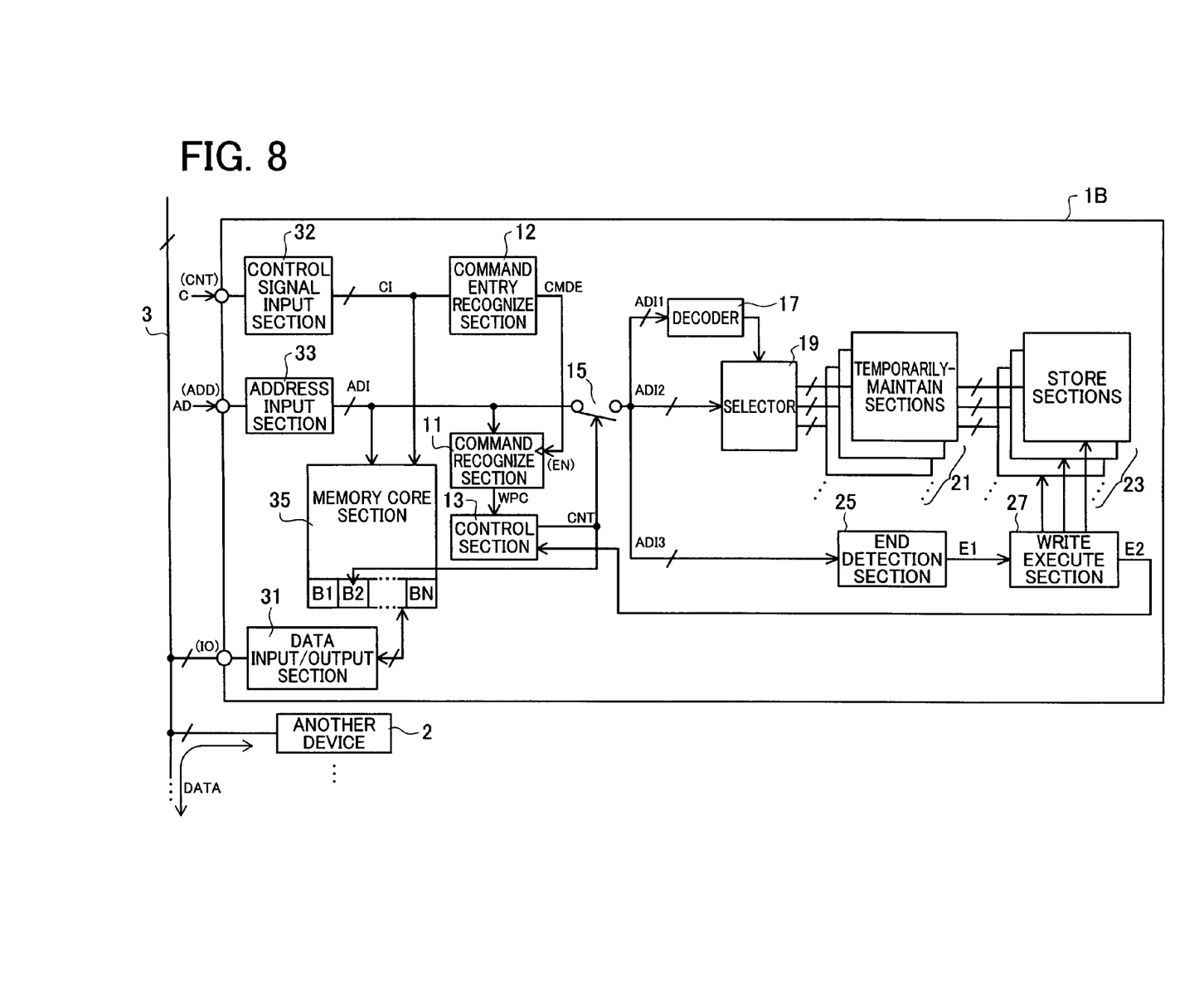
FIG. 8 is a circuit block diagram showing part of a system including a non-volatile memory device according to a second embodiment of the present invention.

FIG. 8 shows a system in which a non-volatile memory device 1B according to a second embodiment of the present invention is connected with another device 2 via the common data bus 3. In this system, the non-volatile memory device 1B is used in place of the non-volatile memory device 1A used in the first embodiment (see FIG. 3).

The non-volatile memory device 1B has, in addition to circuitry similar to that of the non-volatile memory device 1A, a command entry recognize section 12. The command entry recognize section 12 receives internal control signals CI outputted from a control signal input section 32 which receives various control signals inputted from the control terminal (C). When internal control signals CI inputted to the command entry recognize section 12 are composed of a combination of predetermined signals and predetermined logic levels, the command entry recognize section 12 determines that there is a request for entering a state of ready to receive a command and outputs a command entry signal CMDE. The command entry signal CMDE is inputted to an enable terminal (EN) of the command recognize section 11 thereby causing the command recognize section 11 to be activated.

The operation performed after the command recognize section 11 is activated is similar to the operation performed in the first embodiment (see FIG. 3) in terms of both process and effect so that its description is omitted here.

The combination of internal control signals CI that defines a command entry is a combination which does not occur in an ordinary access operation. A combination of control signals /WE and /OE both set to a low level, for example, activates both write and read operations. Such a combination of signal settings does not occur in an ordinary access operation. The control signal /WE may be set to a low level with a control signal /WP or /ACC set at a low level. This setting combination activates a write operation while forcefully keeping predetermined sectors or all sectors in a write protected state. Again, such a combination of settings does not occur in an ordinary access operation. Additionally, the control signal /OE may also be set to a low level. Furthermore, it goes without saying that an arrangement may be made to make use of a special control signal for indicating a command entry.

In the non-volatile memory device 1B having the command entry recognize section 12, when a command will be inputted is made known beforehand. Therefore, even when a command is inputted involving an address transition and/or a cycle time similar to those involved in an ordinary address access operation, the operation should not be mistaken for an ordinary address access operation. This allows for increased flexibility in inputting address signals AD as a command. For example, in inputting a command, the data input/output terminals (IO) need not be used. The data input/output terminals (IO) can be released to make the data bus 3 available for use by another bank or another device without causing a command input to be mistaken for an ordinary access operation.

As a result, data transfer efficiency in the system can be improved.

Figure 9:
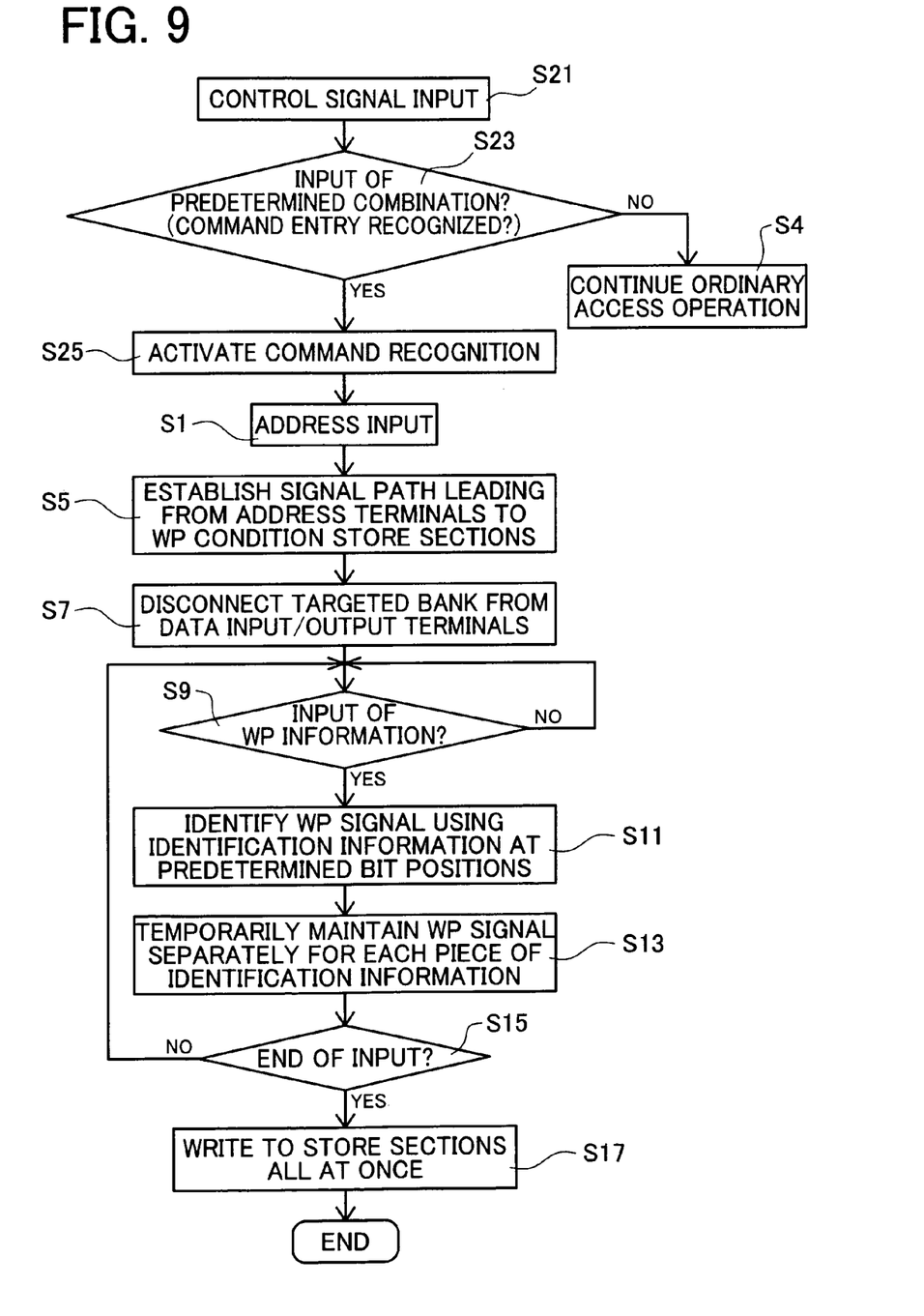
FIG. 9 is a flow diagram showing an information setting method for the non-volatile memory device according to the second embodiment of the present invention.

FIG. 9 is a flow diagram showing a WP condition setting method for the non-volatile memory device 1B according to the second embodiment. The flow of the condition setting operation shown in FIG. 9 is equivalent to the flow of condition setting operation according to the first embodiment (see FIG. 4) with an addition of steps S21 to S25. When a predetermined combination of control signals C is inputted to the control signal input section 32 (S21), the command entry recognize section 12 determines whether or not the inputted control signals C make up a command entry (S23). When the internal control signals CI inputted to the command entry recognize section 12 are composed of a predetermined combination of control signals (S23: YES), the command recognize section 11 is activated by an EN signal (S25). When the internal control signals CI inputted to the command entry recognize section 12 are not identified as a command entry (S23: NO), an ordinary access operation is continued (S4). The operation performed after the command recognize section 11 is activated is similar to the operation performed in the first embodiment (see FIG. 4) in terms of both process and effect so that its description is omitted here.

As obvious from the above description, since, in the present embodiment, WP condition setting commands and WP information composed of control information for setting WP conditions are inputted via the address terminals (ADD) such as predetermined terminals other than the data input/output terminals (IO), the data input/output terminals (IO) can be released during each of step I making up a setting command input period and step II making up a WP information input period.

In each of the non-volatile memory devices 1A and 1B, inputted WP information is temporarily maintained until the WP information input operation is completed. When the input of WP information is completed, the WP information that has been temporarily maintained is written all at once to the store sections 23. The all-at-once write operation can, therefore, advantageously reduce the time required for writing. The output periods for verify signals and confirmation signals issued to grasp the state of write operation or to confirm information to be written can also be shortened. As a result, the time the data input/output terminals (IO) are used can thus be reduced. Furthermore, by executing write operations as internal processing of the non-volatile memory devices 1A and 1B, the data input/output terminals (IO) can be released, even during step III.

In the non-volatile memory devices 1A and 1B each composed of plural banks each of which can be accessed independently of one another, it is possible, even while a WP condition setting operation is being performed, to make access to other banks not being accessed for setting WP conditions or to other devices connected with the same data line. For example, even while data input and output operations are successively performed in a burst operation, a WP condition setting operation can be performed concurrently with the burst operation without requiring the successive input and output operations being carried out to be stopped. It is, therefore, possible to improve data transfer efficiency of the system.

The present invention is not limited to the above embodiments and, needless to say, various changes and modifications can be made within the spirit and scope of the present invention.

Even though the above embodiments concern WP condition setting operations, it goes without saying that the present invention can also be applied to operations to set various other conditions to be stored in non-volatile memory regions.

Also, putting the connecting section 15 in a non-conducting state is not limited to putting it in such a state when outputting a write end signal E2. For example, it is possible to control the state of the connecting section 15 in response to the result of checking (S15) the state of WP information input. Furthermore, setting the connecting section 15 in a conducting state to establish a signal path (S5) and disconnecting the targeted bank from the data input/output terminals (IO) (S7) may take place in any order.

When the number of sectors or sector groups targeted for a setting operation is smaller than the number of bits of the second WP signal ADI2 representing the number of WP conditions that can be set, the decoder 17 and the selector 19 are not required.

Additionally, the memory core section 35 may be composed of either non-volatile memory cells or volatile memory cells.

What is claimed is:

1. An information setting method for a non-volatile memory device receiving control information from an external source, the information setting method characterized by the steps of:
   when a setting command is inputted to predetermined terminals other than data input/output terminals, setting the predetermined terminals from input terminals for receiving address information to input terminals for receiving the control information and for receiving identification information corresponding to the control information;
   identifying the control information to be received in response to the identification information;
   receiving the control information; and
   temporarily maintaining the control information.

2. The information setting method for a non-volatile memory device in accordance with claim 1, wherein the step of temporarily maintaining the control information comprises the step of temporarily maintaining the control information to be inputted in a predetermined order the information setting method further characterized by the step of storing the control information in a non-volatile memory region after input of the control information is completed.

3. The information setting method for a non-volatile memory device in accordance with claim 1 further characterized by the steps of:
   setting a write protect function for each predetermined memory region in accordance with the control information; and
   setting a function of write prohibition or write permission for each predetermined memory region in accordance with the control information.

4. An information setting method for a non-volatile memory device receiving control information from an external source, the information setting method characterized by the steps of:
   when a setting command is inputted to predetermined terminals other than data input/output terminals, setting the predetermined terminals from input terminals for receiving address information to input terminals for receiving the control information; and
   repeating the step of setting the input terminals a predetermined number of input cycles, wherein the predetermined terminals include address terminals, and wherein the setting command comprises a combination of predetermined bit positions of the address terminals.

5. The information setting method for a non-volatile memory device in accordance with claim 4, wherein the combination of the predetermined bit positions of the address terminals includes bit positions not assigned for identifying a memory cell position in a memory cell array.

6. The information setting method for a non-volatile memory device in accordance with claim 4, wherein the repeating step comprises the step of repeating the step of setting the input terminals the predetermined number of input cycles, wherein each of the input cycles comprises a shorter cycle time than a cycle time for address access.

7. An information setting method for a non-volatile memory device receiving control information from an external source, the information setting method characterized by the steps of:
when a setting command is inputted to predetermined address terminals other than data input/output terminals, the predetermined address terminals are set as input terminals for receiving the control information, and wherein the setting command is set by a combination of predetermined bit positions received at the predetermined address terminals; and
repeating the step of setting the input terminals a predetermined number of input cycles, wherein the predetermined bit positions received at the predetermined address terminals include bit positions for selecting a word line in a memory cell array of the non-volatile memory device, and
wherein the step of repeating the setting the input terminals step a predetermined number of input cycles includes the step of inputting the setting command with a combination of the bit positions for selecting the word line such that a different word line in the memory cell array is selected for each of the predetermined number of input cycles.

8. An information setting method for a non-volatile memory device receiving control information from an external source, the information setting method characterized by the steps of:
when a setting command is inputted to predetermined terminals other than data input/output terminals, setting the predetermined terminals from input terminals for receiving address information to input terminals for receiving the control information, the predetermined terminals comprising control terminals; and
setting the control terminals to a ready state in order to receive the setting command in response to input to the control terminals.

9. The information setting method for a non-volatile memory device in accordance with claim 8, wherein the control terminals include a /WE terminal and a /OE terminal, and wherein the step of setting comprises the step of setting the control terminals to a ready state in order to receive the setting command when both the /WE terminal and the /OE terminal are set to a low level.

10. The information setting method for a non-volatile memory device in accordance with claim 8, wherein the control terminals include a /WP terminal or a /ACC terminal, and wherein the step of setting comprises the step of setting the control terminals to a ready state in order to receive the setting command when either the /WP terminal or the /ACC terminal is set to a low level.

11. The information setting method for a non-volatile memory device in accordance with claim 10, wherein the control terminals also include one of a /WE terminal or a /OE terminal, and wherein the step of setting comprises the step of setting the control terminals to a ready state in order to receive the setting command when either the /WE terminal or the /OE terminal is set to a low level.

12. The information setting method for a non-volatile memory device in accordance with claim 8, wherein the control terminals comprise dedicated terminals for controlling a state of ready or not ready to receive the setting command.

13. An information setting method for a non-volatile memory device receiving control information from an external source, the information setting method characterized by the steps of:
receiving a setting command inputted to predetermined terminals other than data input/output terminals;
setting the predetermined terminals from input terminals for receiving address information to input terminals for receiving the control information in response to receiving the setting command;
decoupling the data input/output terminals front an internal circuit in response to receiving the setting command; and
decoupling a predetermined memory region from the data input/output terminals in response to receiving the setting command, the predetermined memory region identified by the control information as one of a plurality of memory regions to which individual data access may be made.

14. A non-volatile memory device for which control information may be set from an external source comprising:
a command recognize section for recognizing input of a setting command to predetermined terminals other than data input/output terminals and generating a recognition signal in response thereto; and
a control section for setting the predetermined terminals from input terminals for receiving address information to input terminals for receiving the control information in response to the recognition signal from the command recognize section.

15. The non-volatile memory device in accordance with claim 14 further comprising:
a temporarily maintain section for temporarily maintaining the control information received at the predetermined terminals; and
a non-volatile store section in which the control information maintained in the temporarily maintain section is stored,
wherein a plurality of the control information maintained in the temporarily maintain section is also stored in the non-volatile store section.

16. The non-volatile memory device in accordance with claim 15, wherein the control section includes a first connecting section for connecting the predetermined terminals to the temporarily maintain section in response to the recognition signal.

17. A non-volatile memory device according to claim 16, wherein the control section sets the predetermined terminals as input terminals for receiving identification information identifying the control information in addition to receiving the control information in response to the recognition signal, and wherein the temporarily maintain section includes one or more portions thereof, each of the plurality of portions provided for each portion of the identification information.

18. A non-volatile memory device according to claim 17 further comprising a second connecting section coupled between the one or more portions of the temporarily maintain section and the predetermined terminals, the second connecting section connecting one or more of the portions of the temporarily maintain section identified by the identification information to the predetermined terminals.

19. The non-volatile memory device in accordance with claim 14, wherein the predetermined terminals include address terminals.

20. The non-volatile memory device in accordance with claim 14, wherein the control section disconnects data input/output terminals from an internal circuit in response to the recognition signal.

21. The non-volatile memory device in accordance with claim 14 further comprising a memory cell array including a plurality of predetermined memory regions to each of which individual data access may be made, wherein the control section disconnects one of the predetermined memory regions in response to the recognition signal, the one of the predetermined memory regions identified in response to the setting command and data input/output terminals.

22. A system comprising:
at least one non-volatile memory device;
a control section for setting control information of the non-volatile memory device, wherein the non-volatile memory device and the control section are connected to a common data line;
predetermined signal lines for connecting the control section and the non-volatile memory device, the predetermined signal lines not including the common data line and not involved in data transmission to or from the at least one non-volatile memory device, wherein the predetermined signal lines are set from transmission lines for address information to transmission lines for the control information when the non-volatile memory device detects a setting command provided thereto on the predetermined signal lines.

* * * * *